United States Patent [19]

Nakatani et al.

[11] 4,067,046
[45] Jan. 3, 1978

[54] SOLID STATE IMAGING DEVICE

[75] Inventors: Hirokuni Nakatani; Toru Takamura, both of Takatsuki; Yoshimitsu Hiroshima, Hirakata; Susumu Hashimoto, Katano, all of Japan

[73] Assignee: Matsushita Electronics Corporation, Osaka, Japan

[21] Appl. No.: 662,337

[22] Filed: Mar. 1, 1976

[30] Foreign Application Priority Data

Mar. 10, 1975 Japan .................................. 50-29373

[51] Int. Cl.² ................................................ H04N 5/30
[52] U.S. Cl. ................................... 358/213; 250/211 J; 358/167
[58] Field of Search ......................... 178/7.1, DIG. 12; 250/211 J, 211 R, 578; 315/169 R, 169 TV; 358/166, 167, 212, 213

[56] References Cited

U.S. PATENT DOCUMENTS 3,946,151  3/1976  Kamiyama et al. ......... 178/DIG. 12

Primary Examiner—Robert L. Richardson
Attorney, Agent, or Firm—Stevens, Davis, Miller & Mosher

[57] ABSTRACT

Solid state imaging device wherein a plurality of picture elements each comprising a MOSFET and a photodiode connected to a source electrode of the MOSFET are arranged in rows and columns. The gate electrodes of the MOSFET in each row are connected in common, the drain electrodes in odd numbered rows and the drain electrodes in even numbered rows are connected in common, respectively within each column and connected to source electrodes of first and second switching MOSFET, respectively, arranged for each column. Drawn electrodes of the first switching MOSFET and drain electrodes of the second switching MOSFET are connected to first and second output lines, respectively, which are connected to input terminals of a differential amplifier. Photo spurious signals sensed at the drain regions of the MOSFET of the picture elements and noise spikes caused by gate-drain capacitances of the switching MOSFET are eliminated, amd the scanning speed is increased.

6 Claims, 2 Drawing Figures

SOLID STATE IMAGING DEVICE

The present invention relates to a two-dimension solid state imaging device comprising a number of photo-detecting means arranged in rows and columns and an electrical scanning circuit for scanning the photo-detecting means by sampling.

The two-dimensional solid state imaging device in which photodiodes or photo-transistors are arranged in a matrix as photo-detecting means and the matrix is read out by an electrical scanning circuit, is basically constructed to pick up photo-electric signals of the photo-detecting means by making use of logical AND functions of switches at crosspoints of rows and columns of the matrix by the electrical scanning circuit.

Figure 1:
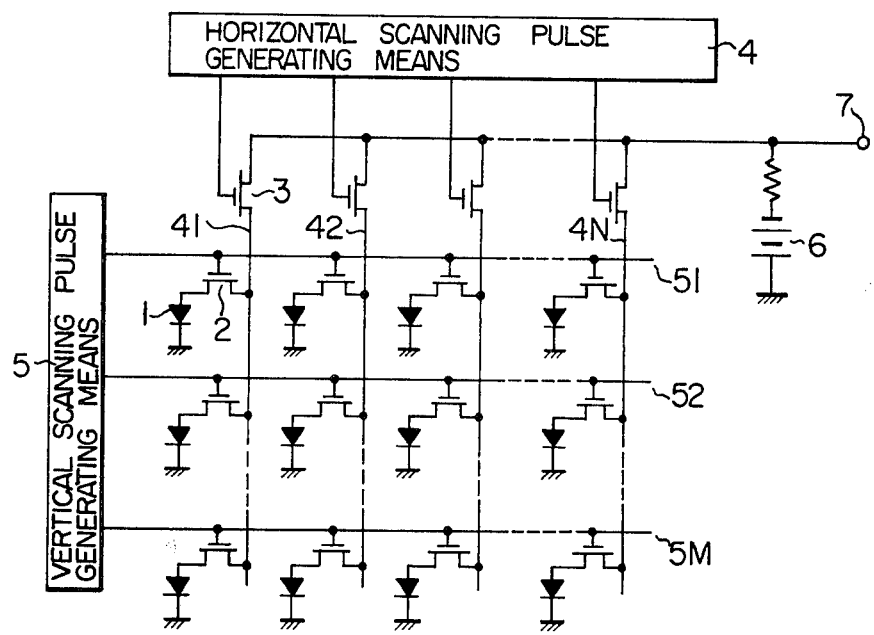
FIG. 1 shows a circuit diagram of a prior art semiconductor optical image detecting apparatus.

A prior art apparatus of the type described above is now explained with reference to FIG. 1. The circuit shown there comprises a plurality of picture elements arrange in M rows and N columns, each consisting of a photodiode 1 and a MOSFET (hereinafter abbreviated as MOST) 2 connected thereto. The matrix is operated in a sampling manner by horizontal pulse generating means 4, horizontal switching MOST's 3 and vertical scanning pulse generating means 5. The operation of the picture element is explained below in connection with the particular picture element arranged at the crosspoint of the first row and the first column. In FIG. 1, an output signal appearing at an output terminal 7, that is, a video signal is a charging current which flows when the junction of the photodiode 1 is changed to a voltage level substantially equal to that of a power supply 6 through a resistor, the horizontal switching MOST 3 and the vertical switching MOST 2 when the vertical switching MOST 2 is rendered conductive by the vertical scanning pulse generating means 5 through a first row bus 51 and the horizontal switching MOST 3 of the first column is rendered conductive by the horizontal scanning pulse generating means 4. On the other hand, the above charging current is to supplement for the electric energy which the photodiode 1 has discharged in proportion to the amount of incident light during one scan period, hence it corresponds to the amount of incident light to the photodiode 1. As the columns 41, 42, ... 4N and the rows 51, 52, ... 5M of the apparatus are selectively scanned in sequence, video signals are picked up at the cross-points by logical AND functions of the vertical switching MOST's 2 and the horizontal switching MOST's 3, which signals are detected as a voltage across the output load resistor. When the circuit shown in FIG. 1 is implemented by conventional semiconductor technology, the connection portions of the vertical switching MOST's 2 corresponding to the column bus 41, for example, that is, the drain regions of the vertical switching MOST's 2 form PN junctions to a substrate as do the source regions thereof which constitute portions of the photodiodes. The drain regions are, therefore, photo-sensitive and should be optically shielded. However, as the integration density of the two-dimension matrix array increases, it becomes more and more difficult to optically shield the drains of the vertical switching MOST's 2 to eliminate noise components from the drain regions. Further, with the above circuit arrangement, since the drain regions of M vertical switching MOST's are connected to each of the column buses 41, 42, ... 4N, photo-signals sensed by the drain regions of the M vertical switching MOST's connected, for example, to the column bus 41 during one horizontal scan period constitute noise components during the readout of a photo-signal which the photodiode 1, for example, senses in one field period. Furthermore, during the readout of the video signal of the photodiode 1, for example, a resistive component of the vertical switching MOST 2 and a capacitive component formed by the column bus 41 and the drain regions of the M vertical switching MOST's impart a large time constant to the circuit resulting in substantial reduction in the upper limit of the scanning speed.

It is, therefore, an object of the present invention to provide a solid state imaging device which eliminates noise components and produces true photo-signal outputs only.

It is another object of the present invention to provide a solid state imaging device which reduces the time constant of the apparatus by one half for increasing the upper limit of the scanning speed.

The solid state imaging device according to the present invention eliminates spurious signals sensed at the adjacent areas of the horizontal switching MOST's and the vertical switching MOST's, i.e., at the drain regions of the vertical switching MOST's during one horizontal scan period, and also eliminates noise spikes caused by gate-drain capacitances of the horizontal switching MOST's so that it can produce only photo-signals which the photo-diodes sense during one field period. Thus, the present apparatus has resolved a big problem in implementing a high density two-dimensional solid state imaging device. Thus, the number of the vertical switching MOST's to be connected to each of the horizontal switching MOST's is reduced to one half and hence the time constant of the circuit is reduced to one half resulting in the increase of the upper limit of the scanning speed.

Figure 2:
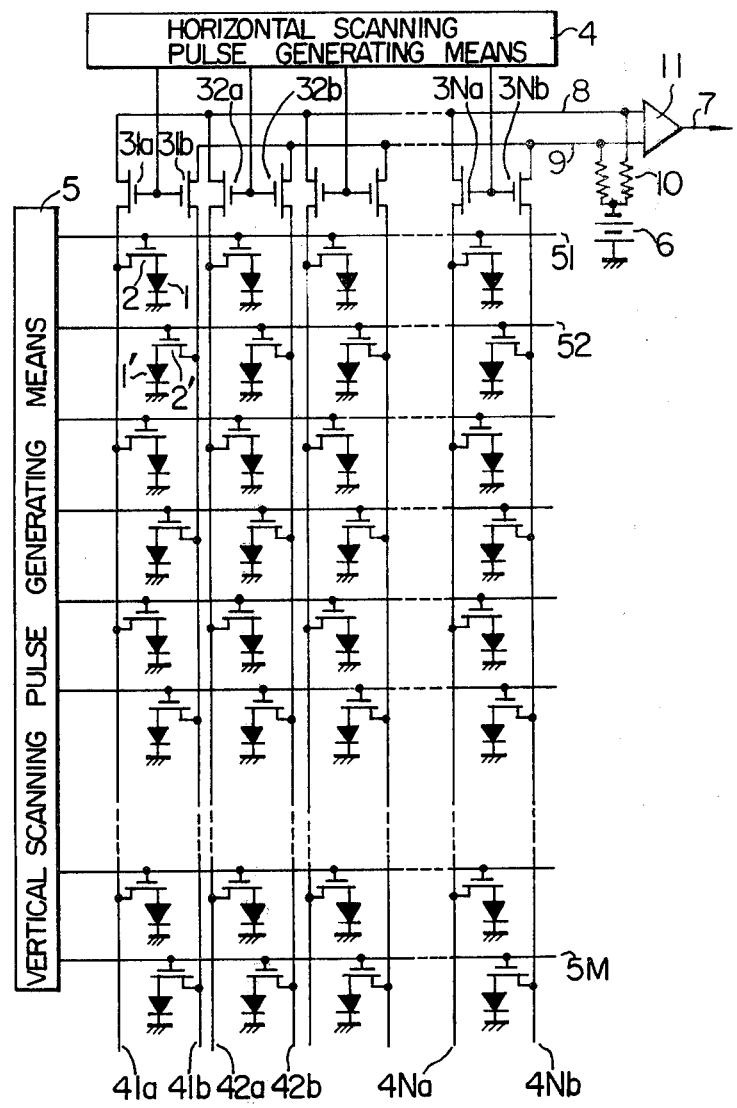
FIG. 2 shows a circuit diagram of one embodiment of a semiconductor optical image detecting apparatus in accordance with the present invention.

The above and other object, features and advantages of the present invention will become more apparent from the following detailed description of the invention when taken in conjunction with FIG. 2 showing an embodiment of the present invention.

In the circuit arrangement shown in FIG. 2, a number of picture elements each consisting of a photodiode 1 or 1' and a vertical switching MOST 2 or 2' connected thereto, are arranged in M rows and N columns with the drain electrodes of the switching MOST's 2 in the odd-numbered rows being connected to the source electrodes of first horizontal switching MOST's 31a to 3Na through column buses 41a to 4Na, respectively, and the drain electrodes of the first horizontal switching MOST's 31a to 3Na being connected in common to a first output line 8. On the other hand, the drain electrodes of the switching MOST's 2' in the even-numbered rows are connected to source electrodes of second horizontal switching MOST's 31b to 3Nb through second column buses 41b to 4Nb, respectively, and the drain electrodes of the second horizontal switching MOST's 31b to 3Nb are connected in common to a second output line 9. The first and second output lines 8 and 9 are connected to input terminals of a differential amplifier 11, and to a power supply terminal 6 through load resistors 10.

The operation of the picture element is now explained in connection with the particular picture elements arranged at the crosspoints of the first row and the first column, and the second row and the first column, respectively. When a vertical scanning pulse is applied by vertical scanning pulse generating means 5 to odd-numbered row buses 51 to which the gate electrodes of the vertical switching MOST's 2 in the odd-numbered rows are connected, the vertical switching MOST 2 in the first row, which is an odd-numbered row, is rendered conductive. At this time, if a horizontal scanning pulse is applied by a horizontal scanning pulse generating means 4 to the gate electrodes of the first and second horizontal switching MOST's 31a and 31b simultaneously, the first and second horizontal switching MOST's 31a and 31b are also rendered conductive. On the first output line 8, there appears a sum of a photo-signal which is proportional to the amount of incident light to the photodiode 1 during one field period, a noise spike due to the gate-drain capacitance of the first horizontal switching MOST's 31a and photo spurious signals sensed by the drain regions of M/2 odd-numbered vertical switching MOST's (e.g. MOST 2) during one horizontal scanning period. On the other hand, on the second output line 9 there appears a sum of a noise spike due to a gate-drain capacitance of the second horizontal switching MOST 31b and photo spurious signals sensed by the drain regions of M/2 even-numbered vertical switching MOST's (e.g. MOST 2') during one horizontal scanning period. Of the above signal components appearing on the first and second output lines 8 and 9, the noise spikes and the photo spurious signals sensed by the drain regions of the respective M/2 vertical switching MOST's (e.g. 2 and 2') are substantially equal, respectively. Accordingly, when the signals appearing on the first and second output lines 8 and 9 are amplified by the differential amplifier 11, only the signal component which is proportional to the amount of incident light to the photodiodes 1 during one field period and which is free from the noise spikes and the photo spurious signal, appears at the output terminal 7. Next, when the horizontal scanning pulse is applied by the horizontal scanning pulse generating means 4 to the gate electrodes of the first and second horizontal switching MOST's 31a to 3Na and 31b to 3Nb sequentially, only the signal components which are free from the noise spikes and the photo spurious signals and which are proportional to the amount of incident light to the photodiodes in the first row during one field period, appear at the output terminal 7. Next, when a vertical scanning pulse is applied by the vertical scanning pulse generating means 5 to the row bus 52 to which the gate electrodes of the vertical switching MOST's 2' in the even-numbered rows are connected, the vertical switching MOST's 2' in the even-numbered row are rendered conductive. If, at the same time, a horizontal scanning pulse is applied by the horizontal scanning pulse generating means 4 to the first and second horizontal switching MOST's 31a and 31b, they are also rendered conductive. On the first and second output lines 8 and 9, signals each opposite to that appearing when the vertical scanning pulse was applied to the odd-numbered row bus 51, appear. Accordingly, when the signals appearing on the first and second output lines 8 and 9 are amplified by the differential amplifier 11, a signal which is proportional to the amount of incident light to the photodiode 2' during one field period appears at the output terminal 7. As the row buses 51 to 5M and the first and second column buses 41a to 4Na and 41b to 4Nb are scanned sequentially, only the signal components which are free from the noise spikes and the photo spurious signals and which are each proportional to the amount of incident light to the photodiodes (e.g., 1, 1') at the respective crosspoints appear sequentially at the output terminal 7.

What is claimed is:

1. A solid state imaging device comprising a plurality of photo-electric transducing means arranged in rows and columns, each of said transducing means including a photo-sensitive device and a vertical switching device having a first electrode connected to one terminal of said photo-sensitive device, a second electrode and a control electrode, the control electrodes of the vertical switching devices in each row being connected in common; a plurality of pairs of horizontal switching devices, one pair being provided for each column, each horizontal switching device having a first electrode, a second electrode and a control electrode, the first electrode of one of said pair of horizontal switching devices being connected in common with the second electrodes of the vertical switching devices in the odd rows of its corresponding column and the first electrode of the other of said pair of horizontal switching devices being connected in common with the second electrodes of the vertical switching devices in the even rows of said corresponding column, the control electrodes of the horizontal switching device in each pair being connected together; a differential amplifier having a first input terminal connected in common to the second electrodes of one of the horizontal switching devices in each pair and a second input terminal connected in common to the second electrodes of the other of the horizontal switching devices in each pair; and first and second load resistors connected between the first and second input terminals of said differential amplifier, a power supply being connected between the junction of said resistors and the other terminals of said photo-sensitive device;

whereby, only noise components are derived from one of the horizontal switching devices in each pair and both noise and signal components in proportion to the quantity of light incident on a corresponding photo-sensitive device are derived from the other of said pair of horizontal switching device when scanning pulses are supplied sequentially to the control electrodes thereof, thereby obtaining only said signal components from the output of said differential amplifier.

2. A solid state imaging device according to claim 1 wherein said vertical and horizontal switching devices are MOSFET's.

3. A solid state imaging device according to claim 2 wherein the first electrodes of said switching devices are source electrodes, the second electrodes are drain electrodes, and the control electrodes are gate electrodes.

4. A solid state imaging device according to claim 1 wherein said photo-sensitive devices are photodiodes.

5. A solid state imaging device according to claim 1 further comprising vertical scanning pulse generating means connected to the control electrodes of said vertical switching devices in each of the rows, and horizontal scanning pulse generating means connected to the control electrodes of said horizontal switching devices in each of the columns.

6. A solid state imaging device according to claim 1 wherein said vertical and horizontal switching devices and said photo-sensitive devices are formed in a common semiconductor substrate.

* * * * *